(12) United States Patent
Chen et al.

(10) Patent No.: US 11,413,934 B2
(45) Date of Patent: Aug. 16, 2022

(54) VEHICLE-MOUNTED HEAT DISSIPATION SYSTEM AND HEAT DISSIPATION METHOD

(71) Applicant: Shanghai Tianma Micro-Electronics Co., Ltd., Shanghai (CN)

(72) Inventors: Donghua Chen, Shanghai (CN); Yongxin He, Shanghai (CN); Ping An, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 228 days.

(21) Appl. No.: 16/913,363

(22) Filed: Jun. 26, 2020

(65) Prior Publication Data
US 2021/0268869 A1    Sep. 2, 2021

(30) Foreign Application Priority Data

Feb. 28, 2020 (CN) .......................... 202010130726.2

(51) Int. Cl.
*B60H 1/00* (2006.01)
*B60K 35/00* (2006.01)
(Continued)

(52) U.S. Cl.
CPC ..... *B60H 1/00899* (2013.01); *B60H 1/00271* (2013.01); *B60K 35/00* (2013.01);
(Continued)

(58) Field of Classification Search
CPC ............ B60H 1/00899; B60H 1/00271; B60H 2001/003; B60H 2001/00307;
(Continued)

(56) References Cited

U.S. PATENT DOCUMENTS

| | | | | |
|---|---|---|---|---|
| 5,890,371 A | * | 4/1999 | Rajasubramanian . | F24F 5/0042 62/332 |
| 7,258,471 B2 | * | 8/2007 | Rodriguez Barros | ...................... B60Q 1/2665 362/545 |
| 7,305,843 B2 | * | 12/2007 | Quisenberry | ......... F28D 15/046 257/E23.098 |
| 7,857,037 B2 | * | 12/2010 | Parish | ................ H05K 7/20336 165/104.21 |

(Continued)

FOREIGN PATENT DOCUMENTS

| | | |
|---|---|---|
| CN | 104684363 A | 6/2015 |
| CN | 109029470 A | 12/2018 |
| CN | 209420222 U | 9/2019 |

OTHER PUBLICATIONS

First Chinese Office Action, dated Jun. 30, 2021, issued in corresponding Chinese Application No. 202010130726.2, filed Feb. 28, 2020, 14 pages.

*Primary Examiner* — Ljiljana V. Cinc
(74) *Attorney, Agent, or Firm* — Christensen O'Connor Johnson Kindness PLLC (57) ABSTRACT

The present disclosure relates to a vehicle-mounted heat dissipation system and a heat dissipation method. The vehicle-mounted heat dissipation system include: a display screen; a heat dissipation structure configured to define a heat dissipation cavity at the back surface of the display screen; an air-cooling heat dissipation device comprising an air supply device, an air inlet, and an air outlet; a water-cooling heat dissipation device comprising a water storage device and a water pipe; and a control device configured to control, if a temperature of the display screen is higher than a first temperature threshold, the vehicle-mounted heat dissipation system to be in an air-cooling heat dissipation mode, and also configured to control, if the temperature of the display screen is higher than a second temperature threshold, the vehicle-mounted heat dissipation system to be in a water-cooling heat dissipation mode.

19 Claims, 6 Drawing Sheets

(51) Int. Cl.
  *B60K 37/04* (2006.01)
  *H05K 7/20* (2006.01)

(52) U.S. Cl.
  CPC ......... *B60K 37/04* (2013.01); *H05K 7/20863* (2013.01); *H05K 7/20872* (2013.01); *H05K 7/20972* (2013.01); *H05K 7/20981* (2013.01); *B60H 2001/003* (2013.01); *B60H 2001/00307* (2013.01); *B60H 2001/00949* (2013.01); *B60K 2370/152* (2019.05); *B60K 2370/658* (2019.05); *B60K 2370/691* (2019.05); *B60K 2370/84* (2019.05); *B60K 2370/91* (2019.05); *H05K 7/20* (2013.01)

(58) Field of Classification Search
  CPC .......... B60H 2001/00949; B60K 35/00; B60K 37/04; B60K 2370/152; B60K 2370/658; B60K 2370/691; B60K 2370/84; B60K 2370/91; H05K 7/20863; H05K 7/20872; H05K 7/20972; H05K 7/20981; H05K 7/20
  See application file for complete search history.

(56) References Cited

U.S. PATENT DOCUMENTS

| | | | |
|---|---|---|---|
| 2009/0087640 A1* | 4/2009 | Li | H05K 7/20981 428/411.1 |
| 2010/0084979 A1* | 4/2010 | Burton | F21V 29/54 362/249.02 |
| 2010/0142149 A1* | 6/2010 | Nakamichi | G09F 9/35 361/701 |
| 2014/0075981 A1* | 3/2014 | Uchida | F25B 13/00 62/498 |
| 2014/0334106 A1* | 11/2014 | Prest | H01L 23/3672 165/185 |
| 2015/0159924 A1* | 6/2015 | Calderon | F25D 11/006 62/3.6 |
| 2016/0255748 A1* | 9/2016 | Kim | G02B 27/017 361/695 |
| 2019/0171263 A1* | 6/2019 | Winkel | G06F 1/3206 |
| 2020/0211918 A1* | 7/2020 | Chung | G06F 1/203 |
| 2020/0219791 A1* | 7/2020 | Seki | H01L 23/49838 |
| 2021/0204444 A1* | 7/2021 | Stefanoski | H01L 23/473 |
| 2021/0204445 A1* | 7/2021 | Stefanoski | G06F 1/20 |

* cited by examiner

VEHICLE-MOUNTED HEAT DISSIPATION SYSTEM AND HEAT DISSIPATION METHOD

CROSS-REFERENCE TO RELATED APPLICATIONS

The present application claims priority to Chinese Patent Application No. 202010130726.2, filed on Feb. 28, 2020, the content of which is incorporated herein by reference in its entirety.

TECHNICAL FIELD

The present disclosure relates to the field of display technologies, and in particular, to a vehicle-mounted heat dissipation system and a heat dissipation method.

BACKGROUND

A vehicle-mounted display screen is an important part of a car. With development of display technologies, users' requirements on a display performance of the vehicle-mounted display screen are increasingly higher, which results in greater power consumption and heat dissipation of a vehicle-mounted display product. In this case, if the heat dissipated by the display screen cannot be discharged in time, it will lead to overheat and thus damage of the display screen. Therefore, it is necessary to solve the problem of timely and effectively discharging the heat dissipated by the display screen.

SUMMARY

In view of this, the embodiments of the present disclosure provide a vehicle-mounted heat dissipation system and a heat dissipation method, which can timely and effectively implement heat dissipation on the display screen.

In an aspect, an embodiment of the present disclosure provides a vehicle-mounted heat dissipation system, including: a display screen comprising a display surface and a back surface that are opposite to each other; a heat dissipation structure arranged at the back surface of the display screen and configured to define a heat dissipation cavity at the back surface of the display screen; an air-cooling heat dissipation device comprising an air supply device, an air inlet, and an air outlet; a water-cooling heat dissipation device comprising a water storage device and a water pipe, at least a part of the water pipe being arranged in the heat dissipation cavity; and a control device configured to control, if a temperature of the display screen is higher than a first temperature threshold, the vehicle-mounted heat dissipation system to be in an air-cooling heat dissipation mode in which the air supply device is turned on and a passage passing through the air inlet, the heat dissipation cavity and the air outlet is formed, and configured to control, if the temperature of the display screen is higher than a second temperature threshold, the vehicle-mounted heat dissipation system to be in a water-cooling heat dissipation mode in which liquid in the water storage device flows in the water pipe. The second temperature threshold is higher than the first temperature threshold.

In another aspect, an embodiment of the present disclosure provides a heat dissipation method of the above vehicle-mounted heat dissipation system. The method includes: detecting the temperature of the display screen; and if the temperature of the display screen is higher than the first temperature threshold, controlling the vehicle-mounted heat dissipation system to be in the air-cooling heat dissipation mode, in which the air supply device is turned on and the passage passing through the air inlet, the heat dissipation cavity and the air outlet is formed; or if the temperature of the display screen is higher than the second temperature threshold, controlling the vehicle-mounted heat dissipation system to be in the water-cooling heat dissipation mode, in which the liquid in the water storage device flows in the water pipe.

BRIEF DESCRIPTION OF DRAWINGS

In order to clarify the technical solutions of the embodiments of the present disclosure, the technical solutions in the embodiments of the present disclosure are described in the following with reference to the accompanying drawings. It should be understood that the described embodiments are merely illustrative, and shall not be interpreted as limitations to the present disclosure. Those skilled in the art may obtain other embodiments according to the accompanying drawings of the present disclosure.

DESCRIPTION OF EMBODIMENTS

For better illustrating technical solutions of the present disclosure, the embodiments of the present disclosure will be described in detail as follows with reference to the accompanying drawings.

It should be noted that the described embodiments are merely illustrative, and should not be interpreted as limitations to the present disclosure. Based on the embodiments of the present disclosure, other embodiments obtained by those skilled in the art shall fall within the scope of the present disclosure.

The terms used in the embodiments of the present disclosure are merely for the purpose of describing particular embodiments, but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships. For example, A and/or B may indicate three cases, i.e., A existing individually, A and B existing simultaneously, B existing individually. In addition, the character "/" herein generally indicates that the related objects have an "or" relationship.

It should be understood that, although the baffle may be described using the terms of "first", "second", "third", etc., in the embodiments of the present disclosure, the baffle shall not be limited by these terms. These terms are merely for distinguishing the baffles from one another. For example, without departing from the scope of the embodiments of the present disclosure, a first baffle may also be referred to as a second baffle, and similarly, a second baffle may also be referred to as a first light baffle.

Figure 1:
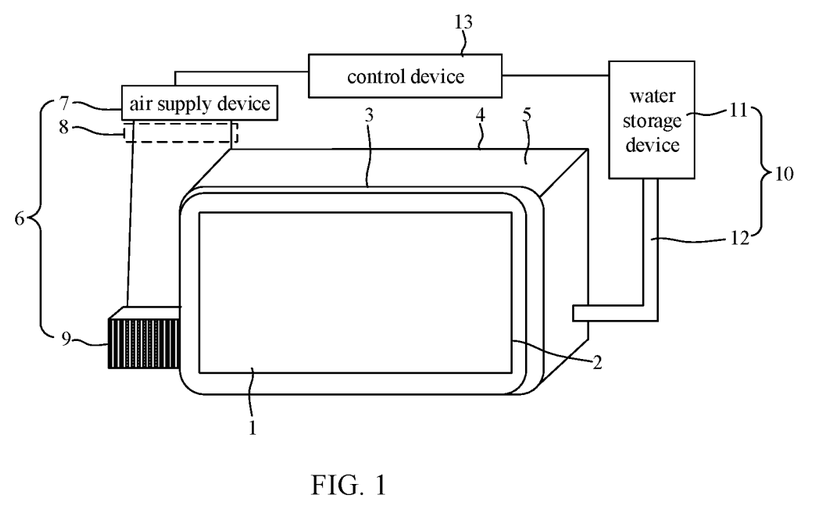
FIG. 1 is a structural schematic diagram of a vehicle-mounted heat dissipation system according to an embodiment of the present disclosure.
Figure 2:
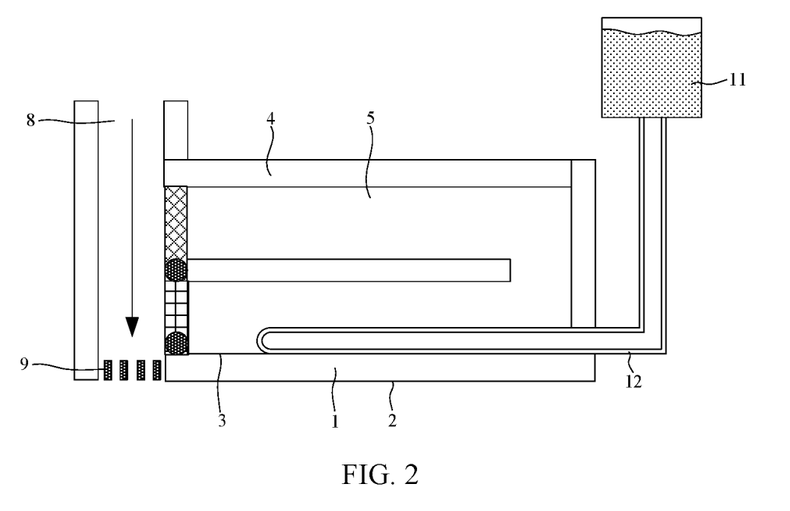
FIG. 2 is a structural schematic diagram of the vehicle-mounted heat dissipation system shown in FIG. 1 when it is not in a heat dissipation mode.
Figure 3:
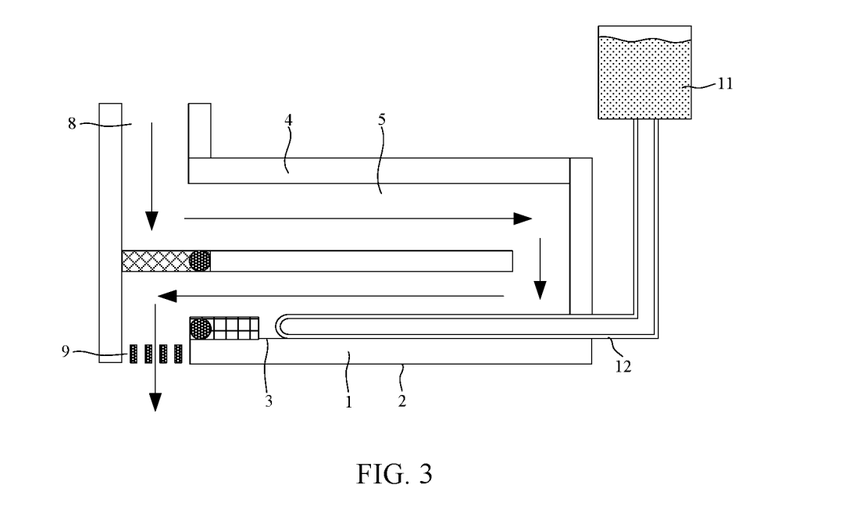
FIG. 3 is a structural schematic diagram of the vehicle-mounted heat dissipation system shown in FIG. 1 when it is in an air-cooling heat dissipation mode.
Figure 4:
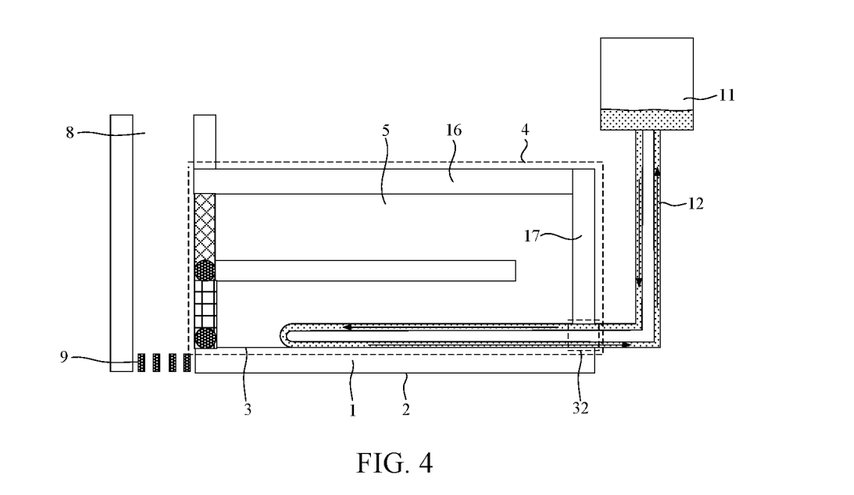
FIG. 4 is a structural schematic diagram of the vehicle-mounted heat dissipation system shown in FIG. 1 when it is in a water-cooling heat dissipation mode.

An embodiment of the present disclosure provides a vehicle-mounted heat dissipation system. FIG. 1 is a structural schematic diagram of a vehicle-mounted heat dissipation system according to an embodiment of the present disclosure; and FIG. 2 is a structural schematic diagram of the vehicle-mounted heat dissipation system shown in FIG. 1 when it is not in a heat dissipation mode. As shown in FIG. 1 and FIG. 2, the vehicle-mounted heat dissipation system includes: a display screen 1 including a display surface 2 and a back surface 3 that are opposite to each other; a heat dissipation structure 4 arranged at the back surface 3 of the display screen 1 and configured to define a heat dissipation cavity 5 at the back surface 3 of the display screen 1; an air-cooling heat dissipation device 6 including an air supply device 7, an air inlet 8, and an air outlet 9; a water-cooling heat dissipation device 10 including a water storage device 11 and a water pipe 12, at least a part of the water pipe 12 being arranged in the heat dissipation cavity 5; and a control device 13. FIG. 3 is a structural schematic diagram of the vehicle-mounted heat dissipation system shown in FIG. 1 when it is in an air-cooling heat dissipation mode, and FIG. 4 is a structural schematic diagram of the vehicle-mounted heat dissipation system shown in FIG. 1 when it is in a water-cooling heat dissipation mode. If a temperature of the display screen 1 is higher than a first temperature threshold (e.g., higher than 40° C.), as shown in FIG. 3, the control device 13 is configured to control the vehicle-mounted heat dissipation system to be in the air-cooling heat dissipation mode, so that the air supply device 7 is turned on, and a passage passing through the air inlet 8, the heat dissipation cavity 5 and the air outlet 9 is formed. If the temperature of the display screen 1 is higher than a second temperature threshold (e.g., higher than 70° C.), as shown in FIG. 4, the control device 13 is configured to control the vehicle-mounted heat dissipation system to be in the water-cooling heat dissipation mode, to allow liquid in the water storage device 11 to flow in the water pipe 12. The second temperature threshold is higher than the first temperature threshold.

With the vehicle-mounted heat dissipation system provided by this embodiment of the present disclosure and based on an arrangement manner of the heat dissipation structure 4, the air-cooling heat dissipation device 6 and the water-cooling heat dissipation device 10, if the temperature of the display screen 1 is higher than the first temperature threshold, the air supply device 7 is controlled to be turned on, so as to form the passage passing through the air inlet 8, the heat dissipation cavity 5 and the air outlet 9. In this case, air outputted from the air supply device 7 enters the air inlet 8 and is dissipated from the air outlet 6 after passing through the heat dissipation cavity 5. Thus, the heat dissipated by the display screen 1 in the heat dissipation cavity 5 is discharged from the air outlet 9 by taking advantage of the flowability of the air. If the temperature of the display screen 1 is higher than the second temperature threshold, the liquid in the water storage device 11 is controlled to flow in the water pipe 12, and thus the heat dissipated by the display screen 1 in the heat dissipation cavity 5 can be discharged by utilizing the flowability of water. Moreover, water has a better heat dissipation effect due to its greater specific heat capacity, and thus the water-cooling heat dissipation mode can be more effective in the heat dissipation of the display screen 1 at a higher temperature.

Therefore, in the vehicle-mounted heat dissipation system provided by this embodiment of the present disclosure, by utilizing two sets of heat dissipation devices, i.e., the air-cooling heat dissipation device 6 and the water-cooling heat dissipation device 10, the heat dissipated by the display screen 1 can be efficiently and timely discharged. In this way, the damage of the components inside the display screen 1, which may be caused by an excessively high temperature of the display screen 1, can be avoided, thereby improving working stability of the display screen 1.

Figure 5:
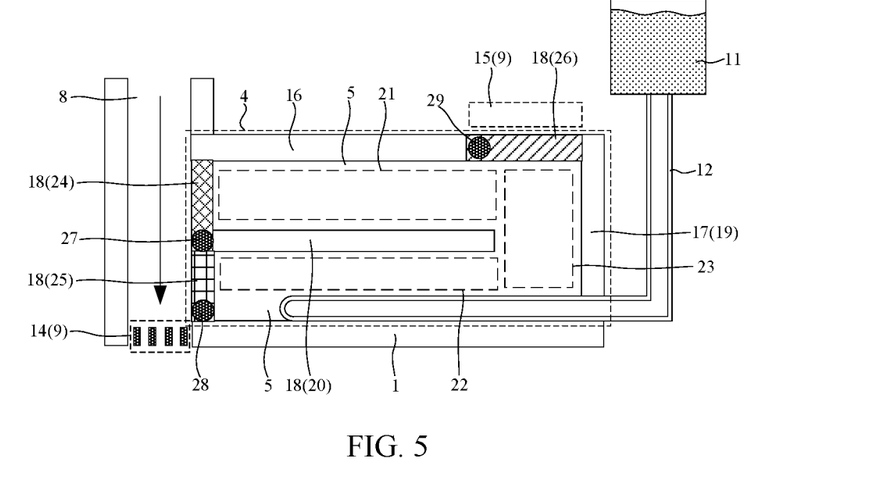
FIG. 5 is another structural schematic diagram of a vehicle-mounted heat dissipation system according to an embodiment of the present disclosure.
Figure 6:
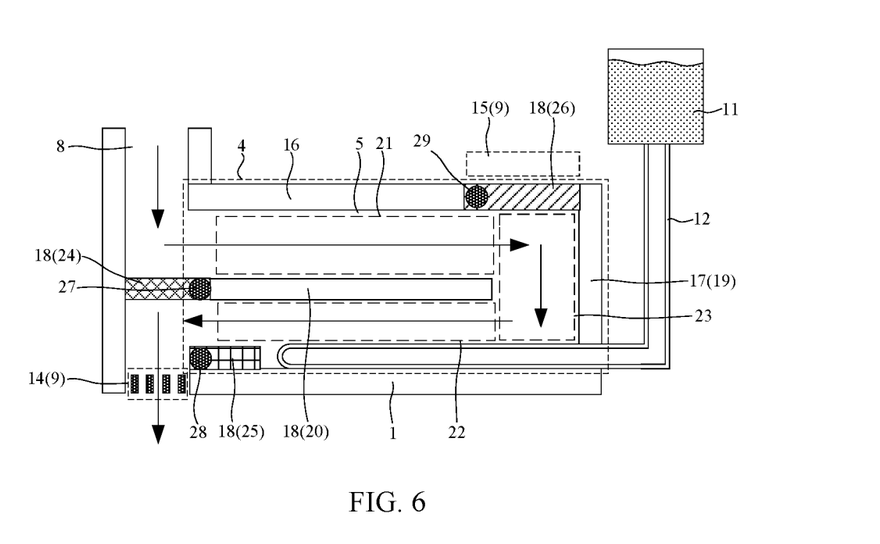
FIG. 6 is a structural schematic diagram of the vehicle-mounted heat dissipation system shown in FIG. 5 when it is in a first air-cooling mode.
Figure 7:
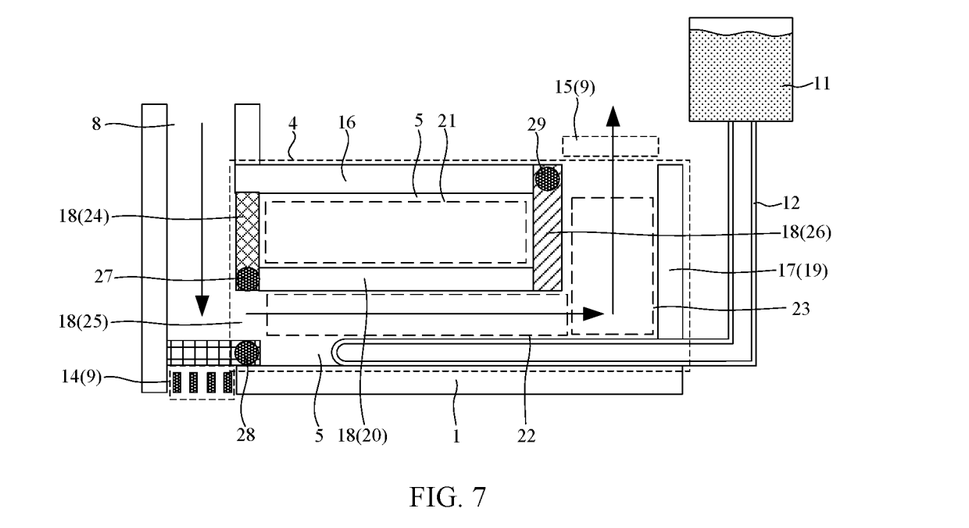
FIG. 7 is a structural schematic diagram of the vehicle-mounted heat dissipation system shown in FIG. 5 when it is in a second air-cooling mode.

FIG. 5 is a another structural schematic diagram of a vehicle-mounted heat dissipation system according to an embodiment of the present disclosure, FIG. 6 is a structural schematic diagram of the vehicle-mounted heat dissipation system shown in FIG. 5 when it is in a first air-cooling mode, and FIG. 7 is a structural schematic diagram of the vehicle-mounted heat dissipation system shown in FIG. 5 when it is in a second air-cooling mode. With reference to FIG. 5 and FIG. 1, the air outlet 9 includes an inner air outlet 14 and an outer air outlet 15. The inner air outlet 14 leads to an interior of a vehicle compartment, and the outer air outlet 15 leads to an exterior of the vehicle compartment. That is, the inner air outlet 14 communicates with the interior of the vehicle compartment and is configured to guide the air outputted from the air supply device 7 into the vehicle compartment, and the outer air outlet 15 communicates with the exterior of the vehicle compartment and is configured to guide the air outputted from the air supply device 7 out of the vehicle. Based on this structure, when the temperature of the display screen 1 is higher than the first temperature threshold, the control device 13 is further configured to detect whether the air supply device 7 is turned on; if the air supply device 7 is turned on, the vehicle-mounted heat dissipation system is controlled to be in the first air-cooling heat dissipation mode (as shown FIG. 6), so as to form a passage passing through the air inlet 8, the heat dissipation cavity 5 and the inner air outlet 14; if the air supply device 7 is not turned on, the vehicle-mounted heat dissipation system is controlled to be in the second air-cooling heat dissipation mode (as shown in FIG. 7), in which the air supply device 7 is turned on and the inner air outlet 14 is closed, so as to form the passage passing through the air inlet 8, the heat dissipation cavity 5 and outer air outlet 15.

For example, when the temperature of the display screen 1 is higher than the first temperature threshold, it is detected at this time whether the air supply device 7 is turned on. If it is detected that the air supply device 7 is turned on, it means that passengers in the vehicle compartment demand for cooling or heating the vehicle compartment. In this case, by forming the passage passing through the air inlet 8, the heat dissipation cavity 5 and the inner air outlet 14, the heat dissipated by the display screen 1 can be directly discharged via the inner air outlet 14, without changing a state of the inner air outlet 14 supplying air to the vehicle compartment, thereby dissipating the heat and satisfying the demand of the passenger in the meantime. If it is detected at this time that the air supply device 7 is not turned on, it means that the passenger in the vehicle compartment does not demand for the cooling or heating the vehicle compartment at this time. In this case, by controlling the inner air outlet 14 to be closed and forming the passage passing through the air inlet 8, the heat dissipation cavity 5 and the outer air outlet 15, the heat dissipated by the display screen 1 can be discharged from the vehicle compartment via the outer air outlet 15 to effectively dissipate the heat, and in the meantime, the air outputted from the air supply device 7 is prevented from flowing into the vehicle compartment via the inner air outlet 14, which would affect the passenger experience.

In an example, as shown in FIG. 5, the heat dissipation structure 4 includes: a bottom plate 16 disposed opposite to the display screen 1; a side wall 17 intersecting with the bottom plate 16; and a heat dissipation plate 18. The heat dissipation cavity 5 is defined by the bottom plate 16, the side wall 17 and the display screen 1. In the first air-cooling heat dissipation mode, the heat dissipation plate 18 is configured to allow the air inlet 8 to communicate with the heat dissipation cavity 5 and allow the heat dissipation cavity 5 to communicate with the inner air outlet 14; and in the second air-cooling heat dissipation mode, the heat dissipation plate 18 is configured to allow the air inlet 8 to communicate with the heat dissipation cavity 5 and allow the heat dissipation cavity 5 to communicate with the outer air outlet 15. By providing the heat dissipation plate 18 in the heat dissipation structure 4, the passage passing through the air inlet 8, the heat dissipation cavity 5 and the inner air outlet 14 or the passage passing through the air inlet 8, the heat dissipation cavity 5 and the outer air outlet 15 can be controlled to be formed by utilizing the heat dissipation plate 18, such that the heat dissipated by the display screen 1 is discharged via the inner air outlet 14 in the air-cooling heat dissipation mode, and the heat dissipated by the display screen 1 is discharged via the outer air outlet 15 in the second air-cooling mode. In this way, the heat can be dissipated without affecting passenger experience.

Further, with further reference to FIG. 5, the side wall 17 includes a first side wall 19, and a side of the bottom plate 16 close to the first side wall 19 is spaced apart from the first side wall 19. The heat dissipation plate 18 includes a partition plate 20 located between the bottom plate 16 and the display screen 1, a first baffle 24, a second baffle 25, and a third baffle 26. A side of the partition plate 20 close to the first side wall 19 is spaced apart from the first side wall 19, a first space 21 is formed between the partition plate 20 and the bottom plate 16, a second space 22 is formed between the partition plate 20 and the display screen 1, and a third space 23 is formed between the partition plate 20 and the side wall 17. The first baffle 24 is movably disposed at a side of the partition plate 20 facing away from the first side wall 19. The second baffle 25 is movably disposed at a side of the display screen 1 facing away from the first side wall 19. The third baffle 26 is movably disposed at the side of the bottom plate 16 close to the first side wall 19.

Based on such a structure, in the first air-cooling heat dissipation mode as shown in FIG. 6, the first baffle 24 moves to allow the air inlet 8 to communicate with the first space 21, and the second baffle 25 moves to allow the second space 22 to communicate with the inner air outlet 14, so that air entering through the inlet 8 and then flows to the inner air outlet 14 after passing through the first space 21, the third space 23, and the second space 22; in the second air-cooling mode as shown in FIG. 7, the first baffle 24 moves to block the communication between the air inlet 8 and the first space 21, the third baffle 26 moves to block the communication between the first space 21 and the third space 23, and the second baffle 25 moves to allow the air inlet 8 to communicate with the second space 22, so that air entering through the air inlet 8 flows to the outer air outlet 15 after passing through the second space 22 and the third space 23.

For example, with reference to FIG. 5 to FIG. 7, when the vehicle-mounted heat dissipation system is not in the heat dissipation mode, the first baffle 24 is located at an air vent of the first space 21 of the heat dissipation cavity 5 facing towards the air inlet 8 to block a passage between the heat dissipation cavity 5 and the air inlet 8, so that the heat dissipation cavity 5 is not in communication with the air inlet 8; the second baffle 25 is located at an air vent of the second space 22 of the heat dissipation cavity 5 facing towards the inner air outlet 14, and the second baffle 25 blocks a passage between the heat dissipation cavity 5 and the inner air outlet 14, so that the heat dissipation cavity 5 is not in communication with the inner air outlet 14; the third baffle 26 is located between the bottom plate 16 and the first side wall 19 to block a passage between the heat dissipation cavity 5 and the outer air outlet 15, and thus the heat dissipation cavity 5 is not in communication with the outer air outlet 15. In this case, the heat dissipation cavity 5 is not in communication with the air inlet 8, and the inner air outlet 14 is not in communication with the outer air outlet 15, i.e., the heat dissipation cavity 5 is an enclosed space. When the vehicle-mounted heat dissipation system is in the first air-cooling heat dissipation mode, the first baffle 24 rotates in a direction facing away from the first side wall 19 to allow the air inlet 8 to communicate with the heat dissipation cavity 5, meanwhile, the second baffle 25 rotates in a direction facing towards the first side wall 19 to allow the heat dissipation cavity 5 to communicate with the inner air outlet 14. In this case, the passage passing through the air inlet 8, the heat dissipation cavity 5 and the inner air outlet 14 are formed, and the air entering through the air inlet 8 flows in the first space 21, the third space 23 and the second space 22 to guide and discharge the heat dissipated by the display screen 1 via the inner air outlet 14, thereby dissipating the heat. When the vehicle-mounted heat dissipation system is in the second air-cooling heat dissipation mode, the second baffle 25 rotates in the direction facing away from the first side wall 19 to allow the air outlet 9 to communicate with the heat dissipation cavity 5, and the third baffle 26 rotates in the direction facing towards the partition plate 20 to allow the heat dissipation cavity 5 to communicate with the outer air outlet 15. In this case, the passage passing through the air inlet 8, the heat dissipation cavity 5 and the outer air outlet 15 is formed, and the air enters through the air inlet 8 flows in the second space 22 and the third space 23 to guide and discharge the heat dissipated by the display screen 1 via the outer air outlet 15.

Based on the arrangement positions and movements of the first baffle 24, the second baffle 25 and the third baffle 26, the first baffle 24, the second baffle 25 and the third baffle 26 are controlled to move in different directions in different heat dissipation modes, and the heat dissipation cavity 5 can be controlled to be in communication with or not in communication with the inner air outlet 14 and outer air outlet 15 through the interaction of the three baffles. In this way, the heat dissipated by the display screen 1 can be discharged via the inner air outlet 14 in the first air-cooling heat dissipation mode, and the heat dissipated by the display screen 1 can be discharged via the outer air outlet 15 in the second air-cooling heat dissipation mode, thereby effectively dissipating the heat.

For example, with further reference to FIG. 5 to FIG. 7, the first baffle 24 is provided at a side of the partition plate 20 facing away from the first side wall 19 by means of a first rotation shaft 27, which drives the first baffle 24 to rotate in the direction facing towards the first side wall 19 or in the direction facing away from the first side wall 19; the second baffle 25 is provided at a side of the display screen 1 facing away from the first side wall 19 by means of a second rotation shaft 28, which drives the second baffle 25 to rotate in the direction facing towards the first side wall 19 or in the direction facing away from the first side wall 19; the third baffle 26 is provided at the side of the bottom plate 16 close to the first side wall 19 by means of a third rotation shaft 29, which drives the third baffle 26 to rotate in the direction facing towards the partition plate 19 or in the direction facing away from the partition plate 19. The respective rotation shafts rotate and drive the baffles to move, thereby accurately forming or blocking the communications between the heat dissipation cavity 5 and the air inlet 8, the inner air outlet 15 or the outer air outlet 15, which is easy in operation.

Figure 8:
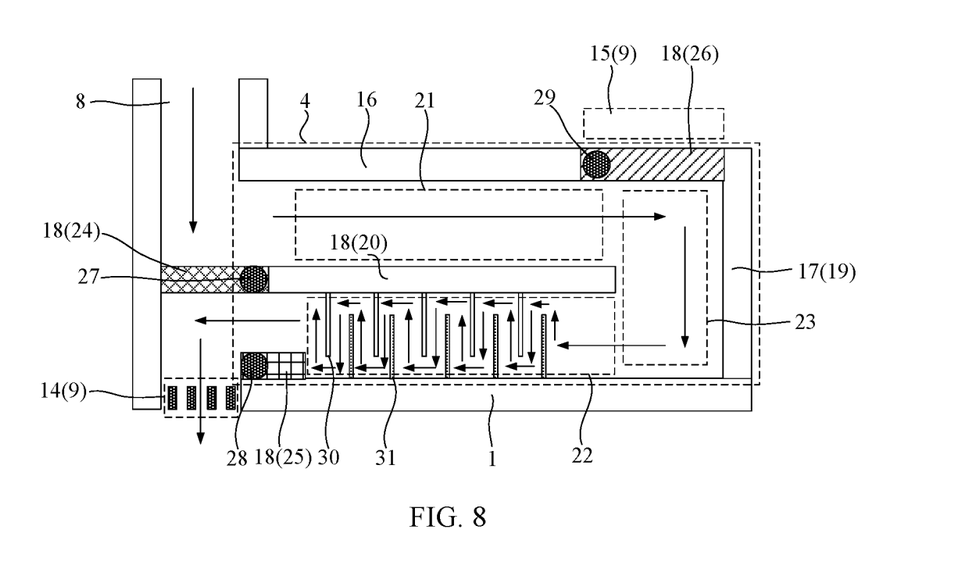
FIG. 8 is yet another structural schematic diagram of a vehicle-mounted heat dissipation system according to an embodiment of the present disclosure.

FIG. 8 is yet another structural schematic diagram of a vehicle-mounted heat dissipation system according to an embodiment of the present disclosure. For example, with reference to FIG. 1 and FIG. 8, the heat dissipation structure 4 further includes a plurality of first auxiliary heat dissipation sheets 30 and a plurality of second auxiliary heat dissipation sheets 31. The first auxiliary heat dissipation sheets 30 are arranged at a side of the partition plate 20 facing towards the display screen 1 and spaced apart from the display screen 1. The second auxiliary heat dissipation sheets 31 are arranged at a side of the display screen 1 facing towards the partition plate 20 and spaced apart from the partition plate 20. In a direction parallel to a plane of the display screen 1, the first auxiliary heat dissipation sheets 30 and the second auxiliary heat dissipation sheets 31 are alternately arranged. In an example that the heat dissipated by the display screen 1 is discharged via the inner air outlet 14, as shown in FIG. 8, due to the presence of the first auxiliary heat dissipation sheets 30 and the second auxiliary heat dissipation sheets 31, the air flows along a meandering path defined by the first auxiliary heat dissipation sheets 30 and the second auxiliary heat dissipation sheets 31 when passing through the second space 22, which allows the air to pass a longer flowing path. In this way, the heat dissipated by the display screen 1 can be sufficiently absorbed and discharged, thereby achieving a better heat dissipation effect.

In an example, the air supply device 7 is a vehicle-mounted air conditioner. The existing vehicle-mounted air conditioner in the vehicle compartment is used as the air supply device 7 of the air-cooling heat dissipation device 6, without providing an additional air supply device 7, thereby simplifying a structure of a module of the vehicle-mounted heat dissipation system and reducing a production cost of the module. It can be understood that, it is also possible in other embodiments of the present disclosure that the air-cooling heat dissipation device 6 may also adopt a separate air supply device 7, instead of using the existing air supply device 7 in the vehicle compartment.

In an example, with further reference to FIG. 4, at least a part of the water pipe 12 is adhered to the back surface 3 of the display screen 1, so that the water pipe 12 is in direct contact with the back surface 3 of the display screen 1. When the water-cooling heat dissipation mode is adopted to dissipate the heat, the liquid flowing in the water pipe 12 can cool the display screen 1 to a greater extent, thereby optimizing the heat dissipation effect.

In an example, with further reference to FIG. 4, the heat dissipation structure 4 includes a bottom plate 16 disposed opposite to the display screen 1, and a side wall 17 intersecting with bottom plate 16. The heat dissipation cavity 5 is defined by the bottom plate 16, the side wall 17 and the display screen 1. The side wall 17 is provided with a through hole 32, through which the water pipe 12 is connected to the water storage device 11. The water pipe 12 may be installed in various ways. For example, after the display screen 1 is manufactured, the water pipe 12 may be fixed to the heat dissipation structure 4 during the formation of the heat dissipation structure 4 at the back surface 3 of the display screen 1. When the display screen 1 and the heat dissipation structure 4 are installed in the vehicle compartment, an end of the water pipe 12 is connected to the water storage device 11. In another embodiment, the water pipe 12 may also be fixed thereafter, that is, the display screen 1 and the heat dissipation structure 4 are first manufactured, when the display screen 1 and heat dissipation structure 4 are installed in the vehicle compartment, the water pipe 12 is fixed to the back surface 3 of the display screen 1 by adhesion or other way.

In an example, the water storage device 11 is a water tank for storing glass cleaning water. By utilizing the existing water tank for storing glass cleaning water in the vehicle compartment as the water tank of the water-cooling heat dissipation device 10, the structure of the module of the vehicle-mounted heat dissipation system is simplified and thus the production cost of the module is reduced. It should be noted that, in other embodiments of the present disclosure, the water-cooling heat dissipation device 10 may adopt a separate water supply, instead of using the existing water tank in the vehicle compartment.

Figure 9:
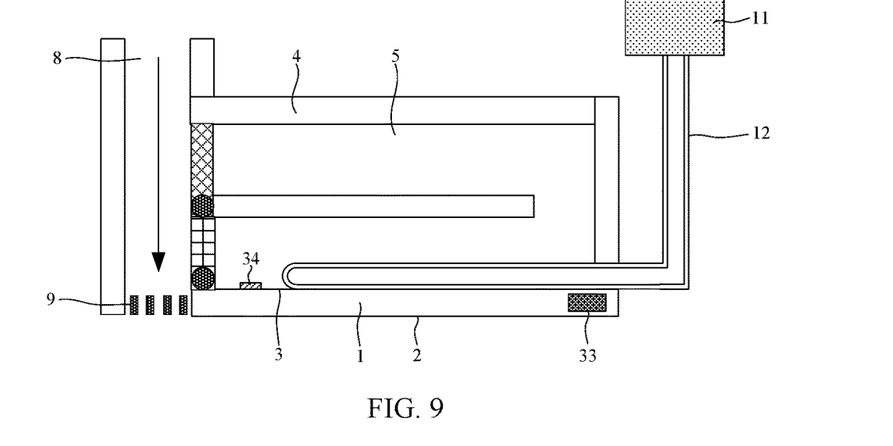
FIG. 9 is yet another structural schematic diagram of a vehicle-mounted heat dissipation system according to an embodiment of the present disclosure.

FIG. 9 is yet another structural schematic diagram of a vehicle-mounted heat dissipation system according to an embodiment of the present disclosure. With reference to FIG. 9, the vehicle-mounted heat dissipation system further includes a brightness adjustment device 33. The brightness adjustment device 33 is configured to decrease a display brightness of the display screen 1 when the temperature of the display screen 1 is higher than the second temperature threshold. If the temperature of the display screen 1 is higher than the second temperature threshold, the display screen 1 is at a relatively high temperature. In this case, in order to ensure the normal operation of the display screen 1, the water-cooling heat dissipation device 10 is used to dissipate the heat, and the power consumption of the display screen 1 is decreased by decreasing the display brightness of the display screen 1. In this way, the heat dissipated by the display screen 1 is reduced, so as to avoid the damage of the display screen 1 caused by the excessively high temperature. It should be noted that the brightness adjustment device 33 may be an internal structure of the display screen 1, or may be integrated into a driver chip of the display screen 1.

With further reference to FIG. 9, for example, the vehicle-mounted heat dissipation system further includes a temperature detection device 34 arranged inside the heat dissipation structure 4 and electrically connected to the control device 13. The temperature detection device 34 may be a temperature sensor. The temperature detection device 34 is configured to detect the temperature of the display screen 1 and transmit the information about the detected temperature to the control device 13. Further, the control device 13, based on the received information about the temperature, determines whether the temperature of the display screen 1 is higher than the first temperature threshold or higher than the second temperature threshold. Moreover, the temperature detection device 34 may be directly arranged at the back surface 3 of the display screen 1, so as to more accurately detect the temperature of the display screen 1.

In an example, the display screen 1 is an organic light-emitting diode display screen, or the display screen 1 is a micro light-emitting diode display screen. Compared with a liquid crystal display screen, the organic light-emitting diode display screen and the micro light-emitting diode display screen both do not require a backlight source, and thus have a thinner and lighter display module. Therefore, by providing the organic light-emitting diode display screen or the micro light-emitting diode display screen as the display screen 1 provided by this embodiment of the present disclosure, after the heat dissipation structure 4 is arranged at the back surface of the display screen 1 to form the heat dissipation cavity 5, the space occupied by the whole module formed by the display screen 1 and the heat dissipation structure 4 can be reduced, which is conducive to the design of thin and light module.

Figure 10:
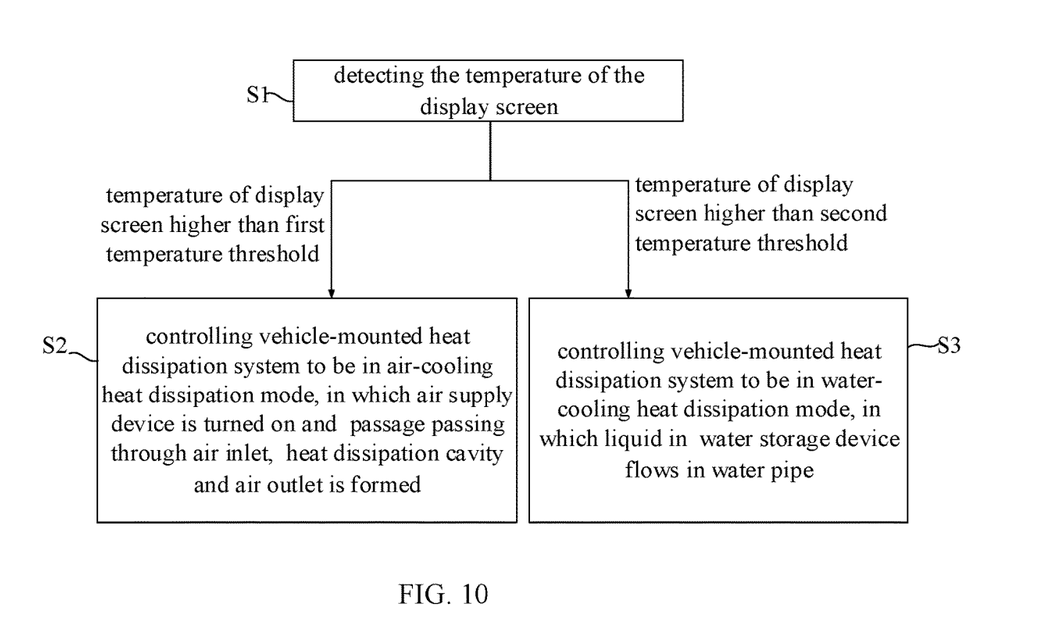
FIG. 10 is a flowchart of a heat dissipation method according to an embodiment of the present disclosure.

An embodiment of the present disclosure further provides a heat dissipation method, which is applicable to the vehicle-mounted heat dissipation system described above. The structure of the vehicle-mounted heat dissipation system has been described in detail in the above embodiments, which will not be repeat herein. FIG. 10 is a flowchart of a heat dissipation method provided by an embodiment of the present disclosure. With reference to FIG. 10, in combination with FIG. 1 to FIG. 4, the heat dissipation method includes following steps.

At a step S1, the temperature of the display screen 1 is detected, if the temperature of the display screen 1 is higher than the first temperature threshold, a step S2 is performed, and if the temperature of the display screen 1 is higher than the second temperature threshold, a step S3 is performed. Herein, the second temperature threshold is higher than the first temperature threshold.

At a step S2, the vehicle-mounted heat dissipation system is controlled to be in the air-cooling heat dissipation mode, in which the air supply device 7 is turned on, and the passage passing through the air inlet 8, the heat dissipation cavity 5 and the air outlet 9 is formed, such that the air outputted from the air supply device 7 enters the air inlet 8 and exits from the air outlet 9 after passing through the heat dissipation cavity 5, and the heat dissipated by the display screen 1 is discharged via the air outlet 9 utilizing flowability of the air.

At a step S3, the vehicle-mounted heat dissipation system is controlled to be in the water-cooling heat dissipation mode, in which the liquid in the water storage device 11 flows in the water pipe 12, such that the heat dissipated by the display screen 1 is discharged by utilizing flowability of the water. Herein, the second temperature threshold is higher than the first temperature threshold.

In the heat dissipation method provided by the embodiment of the present disclosure, when the temperature of the display screen 1 is higher than the first temperature threshold, by controlling the air supply device 7 to be turned on and forming the passage passing through the air inlet 8, the heat dissipation cavity 5 and the air outlet 9, the heat dissipated by the display screen 1 in the heat dissipation cavity 5 can be discharged via the air outlet 9 by utilizing the flowability of the air; and when the temperature of the display screen 1 is higher than the second temperature threshold, by controlling the liquid in the water storage device 11 to flow in the water pipe 12, the heat dissipated by the display screen 1 in the heat dissipation cavity 5 can be discharged by utilizing the flowability of the water. Thus, in the heat dissipation method provided by this embodiment of the present disclosure, two sets of heat dissipation devices, i.e., the air-cooling heat dissipation device 6 and the water-cooling heat dissipation device 10, are used to efficiently and timely discharge the heat dissipated by the display screen 1. In this way, the damage of the components inside the display screen 1, which would be caused by an excessively temperature of the display screen 1, can be avoided, thereby improving working stability of the display screen 1. Moreover, water has a better heat dissipation effect due to its a greater specific heat capacity, and the water-cooling heat dissipation mode can more effectively dissipate the heat of the display screen 1 when it is at a higher temperature.

With reference to FIG. 5 to FIG. 7, for example, the air outlet 9 includes an inner air outlet 14 and an outer air outlet 15. The inner air outlet 14 leads to an interior of the vehicle compartment and the outer air outlet 15 leads to an exterior of the vehicle compartment. That is, the inner air outlet 14 communicates with the interior of the vehicle compartment and is configured to guide the air outputted from the air supply device 7 into the vehicle compartment, and the outer air outlet 15 communicates with the exterior of the vehicle compartment and is configured to guide the air outputted from the air supply device 7 out of the vehicle.

Figure 11:
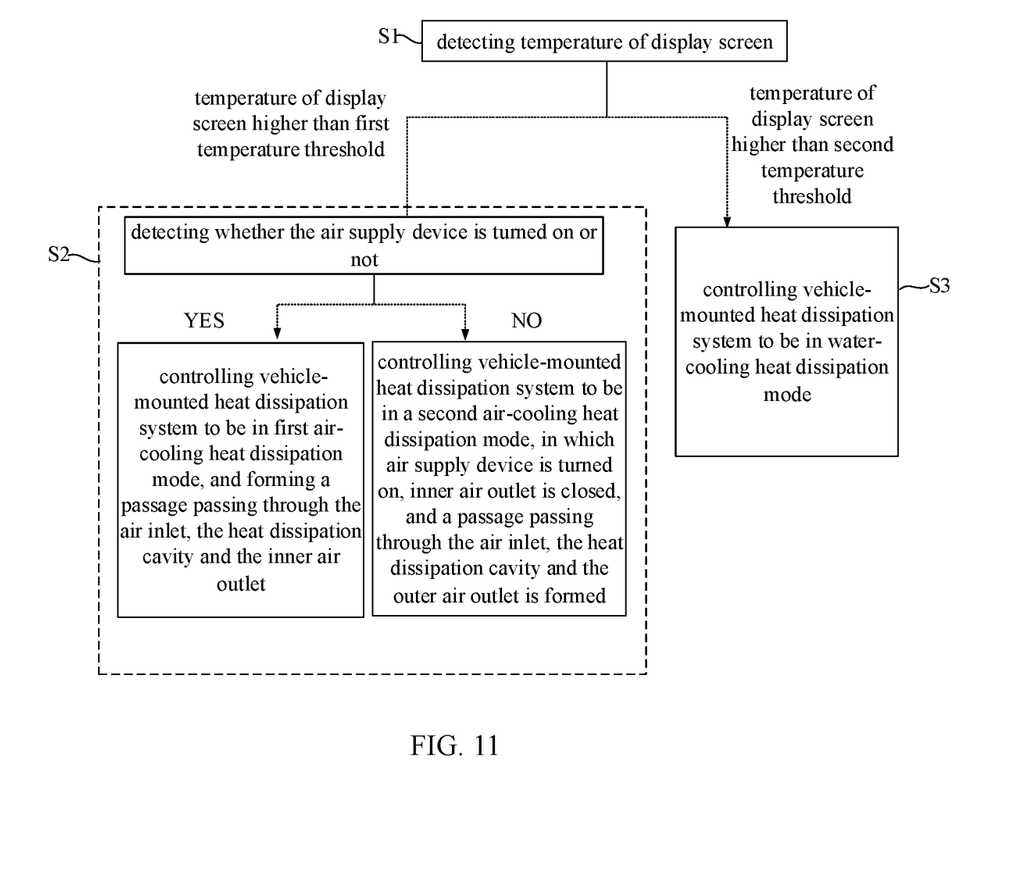
FIG. 11 is a flowchart of another heat dissipation method according to an embodiment of the present disclosure.

FIG. 11 is another flowchart of a heat dissipation method according to an embodiment of the present disclosure. Based on the structure described above, with reference to FIG. 11, the heat dissipation method further includes: detecting whether the air supply device 7 is turned on or not when the temperature of the display screen 1 is higher than the first temperature threshold; if the air supply device 7 is turned on, controlling the vehicle-mounted heat dissipation system to be in the first air-cooling heat dissipation mode to form a passage passing through the air inlet 8, the heat dissipation cavity 5 and the inner air outlet 14; and if the air supply device 7 is not turned on, controlling the vehicle-mounted heat dissipation system to be in the second air-cooling heat dissipation mode, in which the air supply device 7 is turned on and the inner air outlet 14 is closed, so as to form the passage passing through the air inlet 8, the heat dissipation cavity 5 and outer air outlet 15.

If the temperature of the display screen 1 is higher than the first temperature threshold, it is detected at this time whether the air supply device 7 is turned on. If it is detected that the air supply device 7 is turned on, it means that the passenger in the vehicle compartment has a demand for cooling or heating the vehicle compartment at this time. In this case, by forming the passage passing through the air inlet 8, the heat dissipation cavity 5 and the inner air outlet 14, the heat dissipated by the display screen 1 can be directly discharged via the inner air outlet 14, without changing a state of using the inner air outlet 14 supplying air to the vehicle compartment. In this way, the heat can be dissipated while satisfying the demand of the passenger. If it is detected at this time that the air supply device 7 is not turned on, it means that the passenger in the vehicle compartment does not require the cooling or heating the vehicle compartment at this time. In this case, by controlling the inner air outlet 14 to be closed and forming the passage passing through the air inlet 8, the heat dissipation cavity 5 and the outer air outlet 15, the heat dissipated by the display screen 1 can be discharged from the vehicle compartment via the outer air outlet 15, thereby effectively dissipating the heat. Moreover, in this case, the air outputted from the air supply device 7 is prevented from flowing into the vehicle compartment via the inner air outlet 14, which would affect the passenger experience.

Further, with reference to FIG. 5 to FIG. 7, the heat dissipation structure 4 includes a bottom plate 16 disposed opposite to the display screen 1, a side wall 17 intersecting with the bottom plate 16, and a heat dissipation plate 18. The heat dissipation cavity 5 is defined by the bottom plate 16, the side wall 17 and the display screen 1. The side wall 17 includes a first side wall 19, and a side of the bottom plate 16 close to the first side wall 19 is spaced apart from the first side wall 19. The heat dissipation plate 18 includes a partition plate 20 located between the bottom plate 16 and the display screen 1, a first baffle 24, a second baffle 25, and a third baffle 26. A side of the partition plate 20 close to the first side wall 19 is spaced apart from the first side wall 19, a first space 21 is formed between the partition plate 20 and the bottom plate 16, a second space 22 is formed between the partition plate 20 and the display screen 1, and a third space 23 is formed between the partition plate 20 and the side wall 17. The first baffle 24 is movably disposed at a side of the partition plate 20 facing away from the first side wall 19. The second baffle 25 is movably disposed at a side of the display screen 1 facing away from the first side wall 19. The third baffle 26 is movably disposed at the side of the bottom plate 16 close to the first side wall 19.

Based on the structure described above, in the said step S2, forming the passage passing through the air inlet 8, the heat dissipation cavity 5 and the inner air outlet 14 includes: controlling the first baffle 24 to move to allow the air inlet 8 to communicate with the first space 21; controlling the second baffle 25 to move to allow the second space 22 to communicate with the inner air outlet 14, so that air entering through the inlet 8 flows to the inner air outlet 14 after passing through the first space 21, the third space 23, and the second space 22. For example, with reference to FIG. 6, the first baffle 24 is driven by a first rotation shaft 27 to rotate in a direction facing away from the first side wall 19, so as to allow the air inlet 8 to communicate with the heat dissipation cavity 5; meanwhile, the second baffle 25 is driven by a second rotation shaft 28 to rotate in a direction facing towards the first side wall 19, so as to allow the heat dissipation cavity 5 to communicate with the inner air outlet 14. At this time, the passage passing through the air inlet 8, the heat dissipation cavity 5 and the inner air outlet 14 is formed. The air entering through the air inlet 8 flows in the first space 21, the third space 23, and the second space 22 to guide and discharge the heat dissipated by display screen 1 via the inner air outlet 14.

In the step S2, forming the passage passing through the air inlet 8, the heat dissipation cavity 5 and the outer air outlet 15 includes: controlling the first baffle 24 to move, so as to block the air inlet 8 from communicating with the first space 21; controlling the third baffle 26 to move, so as to block the first space 21 from communicating with the third space 23; and controlling the second baffle 25 to move, so as to allow the air inlet 8 to communicate with the second space 22. In this way, the air entering through the air inlet 8 exits from the outer air outlet 15 after passing through the second space 22 and the third space 23. For example, with reference to FIG. 7, the second baffle 25 is driven by the second rotation shaft 28 to rotate in the direction facing away from the first side wall 19, so as to allow the air outlet 9 to communicate with the heat dissipation cavity 5; and the third baffle 26 is driven by the third rotation shaft 29 to rotate in the direction facing towards the partition plate 20, so as to allow the heat dissipation cavity 5 to communicate with the outer air outlet 15. At this time, the passage passing through the air inlet 8, the heat dissipation cavity 5 and the outer air outlet 15 is formed, and the air entering through the air inlet 8 flows in the second space 22 and the third space 23 to guide and discharge the heat dissipated by display screen 1 via the outer air outlet 15.

Based on the interaction of the first baffle 24, the second baffle 25 and the third baffle 26, the heat dissipation cavity 5 can be controlled to build or block a communication with the inner air outlet 14 and outer air outlet 15. In this way, the heat dissipated by the display screen 1 can be discharged via the inner air outlet 14 in the first air-cooling heat dissipation mode, and the heat dissipated by the display screen 1 can be discharged via the outer air outlet 15 in the second air-cooling heat dissipation mode, thereby effectively dissipating the heat.

With reference to FIG. 9, for example, if the temperature of the display screen 1 is higher than the second temperature threshold, the heat dissipation method further includes: decreasing the display brightness of the display screen 1. When the temperature of the display screen 1 is higher than the second temperature threshold, the display screen 1 is at a relatively high temperature. In this case, in order to ensure the normal operation of the display screen 1, the water-cooling heat dissipation device 10 is used to dissipate the heat, and the power consumption of the display screen 1 is decreased by decreasing the display brightness of the display screen 1. In this way, the heat dissipated by the display screen 1 is reduced, and thus the damage of the display screen 1 caused by the excessively high temperature is avoided.

With reference to FIG. 9, for example, the heat dissipation method provided by this embodiment of the present disclosure further includes: regularly detecting the temperature of the display screen 1, so as to timely determine whether the temperature of the display screen 1 is higher than the first temperature threshold or higher than the second temperature threshold, thereby effectively and timely dissipating the heat of the display screen 1. Further, after the temperature of the display screen 1 is detected, the detected temperature can be displayed on the display screen 1 to inform the passenger of the temperature of the display screen 1. Moreover, the passengers may also choose to turn off the display screen 1 according their actual needs if the temperature of display screen 1 is even higher.

In an example, the heat dissipation method provided by the embodiment of the present disclosure further includes: displaying information about an actual heat dissipation mode on the display screen 1 when the vehicle-mounted heat dissipation system is in the air-cooling heat dissipation mode or in the water-cooling heat dissipation mode, to timely inform the passenger of the heat dissipation.

What is claimed is:

1. A vehicle-mounted heat dissipation system, comprising:
   a display screen comprising a display surface and a back surface that are opposite to each other;
   a heat dissipation structure arranged at the back surface of the display screen and configured to define a heat dissipation cavity at the back surface of the display screen;
   an air-cooling heat dissipation device comprising an air supply device, an air inlet, and an air outlet;

a water-cooling heat dissipation device comprising a water storage device and a water pipe, at least a part of the water pipe being arranged in the heat dissipation cavity; and a control device configured to control, if a temperature of the display screen is higher than a first temperature threshold, the vehicle-mounted heat dissipation system to be in an air-cooling heat dissipation mode in which the air supply device is turned on and a passage is formed through the air inlet, the heat dissipation cavity and the air outlet; and wherein the control device is further configured to control, if the temperature of the display screen is higher than a second temperature threshold, the vehicle-mounted heat dissipation system to be in a water-cooling heat dissipation mode in which liquid in the water storage device flows in the water pipe, wherein the second temperature threshold is higher than the first temperature threshold.

2. The vehicle-mounted heat dissipation system according to claim 1, wherein the air outlet comprises an inner air outlet and an outer air outlet, wherein the inner air outlet leads to an interior of a vehicle compartment, and the outer air outlet leads to an exterior of the vehicle compartment, and wherein the control device is further configured to detect, if the temperature of the display screen is higher than the first temperature threshold, whether the air supply device is turned on or not; configured to control, if the air supply device is turned on, the vehicle-mounted heat dissipation system to be in a first air-cooling heat dissipation mode to form a passage passing through the air inlet, the heat dissipation cavity and the inner air outlet; and configured to control, if the air supply device is not turned on, the vehicle-mounted heat dissipation system to be in a second air-cooling heat dissipation mode, in which the air supply device is turned on, the inner air outlet is closed, and a passage is formed through the air inlet, the heat dissipation cavity and the outer air outlet.

3. The vehicle-mounted heat dissipation system according to claim 2, wherein the heat dissipation structure comprises:
a bottom plate disposed opposite to the display screen;
a side wall intersecting with the bottom plate, wherein the heat dissipation cavity is defined by the bottom plate, the side wall, and the display screen;
a heat dissipation plate configured to allow, in the first air-cooling heat dissipation mode, the air inlet to communicate with the heat dissipation cavity and the heat dissipation cavity to communicate with the inner air outlet; and configured to allow, in the second air-cooling heat dissipation mode, the air inlet to communicate with the heat dissipation cavity and the heat dissipation cavity to communicate with the outer air outlet.

4. The vehicle-mounted heat dissipation system according to claim 3, wherein the side wall comprises a first side wall, and a side of the bottom plate close to the first side wall is spaced apart from the first side wall,
wherein the heat dissipation plate comprises:
a partition plate located between the bottom plate and the display screen, wherein a side of the partition plate close to the first side wall is spaced apart from the first side wall, a first space is formed between the partition plate and the bottom plate, a second space is formed between the partition plate and the display screen, and a third space is formed between the partition plate and the side wall;
a first baffle movably disposed at a side of the partition plate facing away from the first side wall;
a second baffle movably disposed at a side of the display screen facing away from the first side wall; and
a third baffle movably disposed at a side of the bottom plate close to the first side wall,
wherein, in the first air-cooling heat dissipation mode, the first baffle moves to allow the air inlet to communicate with the first space, and the second baffle moves to allow the second space to communicate with the inner air outlet, such that air entering through the air inlet flows to the inner air outlet after passing through the first space, the third space, and the second space; and
in the second air-cooling heat dissipation mode, the first baffle moves to block the air inlet from communicating with the first space, the third baffle moves to block the first space from communicating with the third space, and the second baffle moves to allow the air inlet to communicate with the second space, such that the air entering through the air inlet flows to the outer air outlet after passing through the second space and the third space.

5. The vehicle-mounted heat dissipation system according to claim 4, wherein
the first baffle is disposed at the side of the partition plate facing away from the first side wall by means of a first rotation shaft;
the second baffle is disposed at the side of the display screen facing away from the first side wall by means of a second rotation shaft; and
the third baffle is disposed at the side of the bottom plate close to the first side wall by means of a third rotation shaft.

6. The vehicle-mounted heat dissipation system according to claim 4, wherein the heat dissipation structure further comprises a plurality of first auxiliary heat dissipation sheets and a plurality of second auxiliary heat dissipation sheets,
wherein the plurality of first auxiliary heat dissipation sheets is located at a side of the partition plate facing towards the display screen and is spaced apart from the display screen, and the plurality of second auxiliary heat dissipation sheets is located at a side of the display screen facing towards the partition plate and is spaced apart from the partition plate, and
wherein the plurality of first auxiliary heat dissipation sheets and the plurality of second auxiliary heat dissipation sheets are alternately arranged in a direction parallel to a plane of the display screen.

7. The vehicle-mounted heat dissipation system according to claim 1, wherein the air supply device is a vehicle-mounted air conditioner.

8. The vehicle-mounted heat dissipation system according to claim 1, wherein at least a part of the water pipe is adhered to the back surface of the display screen.

9. The vehicle-mounted heat dissipation system according to claim 1, wherein the heat dissipation structure comprises:
a bottom plate disposed opposite to the display screen; and
a side wall intersecting with the bottom plate and provided with a through hole,
wherein the heat dissipation cavity is defined by the bottom plate, the side wall, and the display screen, and the water pipe is connected to the water storage device via the through hole.

10. The vehicle-mounted heat dissipation system according to claim 1, wherein the water storage device is a water tank for storing glass cleaning water.

11. The vehicle-mounted heat dissipation system according to claim 1, further comprising a brightness adjustment device, wherein the brightness adjustment device is configured to decrease a display brightness of the display screen if the temperature of the display screen is higher than the second temperature threshold.

12. The vehicle-mounted heat dissipation system according to claim 1, further comprising a temperature detection device arranged in the heat dissipation structure and electrically connected to the control device.

13. The vehicle-mounted heat dissipation system according to claim 1, wherein the display screen is an organic light-emitting diode display screen or a micro light-emitting diode display screen.

14. A heat dissipation method for the vehicle-mounted heat dissipation system according to claim 1, comprising:
   detecting the temperature of the display screen; and
   if the temperature of the display screen is higher than the first temperature threshold, controlling the vehicle-mounted heat dissipation system to be in the air-cooling heat dissipation mode, in which the air supply device is turned on and the passage passing through the air inlet, the heat dissipation cavity and the air outlet is formed; or
   if the temperature of the display screen is higher than the second temperature threshold, controlling the vehicle-mounted heat dissipation system to be in the water-cooling heat dissipation mode, in which the liquid in the water storage device flows in the water pipe.

15. The heat dissipation method according to claim 14, wherein the air outlet comprises an inner air outlet and an outer air outlet, the inner air outlet leads to an interior of a vehicle compartment, and the outer air outlet leads to an exterior of the vehicle compartment, and
   wherein the heat dissipation method further comprises:
      if the temperature of the display screen is higher than the first temperature threshold, detecting whether the air supply device is turned on or not; and
      if the air supply device is turned on, controlling the vehicle-mounted heat dissipation system to be in a first air-cooling heat dissipation mode, in which a passage passing through the air inlet, the heat dissipation cavity and the inner air outlet is formed; or
      if the air supply device is not turned on, controlling the vehicle-mounted heat dissipation system to be in a second air-cooling heat dissipation mode, in which the air supply device is turned on, the inner air outlet is closed, and a passage passing through the air inlet, the heat dissipation cavity and the outer air outlet is formed.

16. The heat dissipation method according to claim 15, wherein the heat dissipation structure comprises:
   a bottom plate disposed opposite to the display screen;
   a side wall intersecting with the bottom plate, wherein the heat dissipation cavity is defined by the bottom plate, the side wall, and the display screen, the side wall comprises a first side wall, and a side of the bottom plate close to the first side wall is spaced apart from the first side wall; and
   a heat dissipation plate comprising:
      a partition plate located between the bottom plate and the display screen, wherein a side of the partition plate close to the first side wall is spaced apart from the first side wall, a first space is formed between the partition plate and the bottom plate, a second space is formed between the partition plate and the display screen, and a third space is formed between the partition plate and the side wall;
      a first baffle movably disposed at a side of the partition plate facing away from the first side wall;
      a second baffle movably disposed at a side of the display screen facing away from the first side wall; and
      a third baffle movably disposed at a side of the bottom plate close to the first side wall,
   wherein said controlling the vehicle-mounted heat dissipation system to be in the first air-cooling heat dissipation mode, in which a passage is formed through the air inlet, the heat dissipation cavity and the inner air outlet, comprises: controlling the first baffle to move to allow the air inlet to communicate with the first space; and controlling the second baffle to move to allow the second space to communicate with the inner air outlet, such that air entering through the air inlet flows to the inner air outlet after passing through the first space, the third space and the second space, and
   wherein said controlling the vehicle-mounted heat dissipation system to be in the second air-cooling heat dissipation mode, in which the air supply device is turned on, the inner air outlet is closed, and a passage passing through the air inlet, the heat dissipation cavity and the outer air outlet is formed comprises: controlling the first baffle to move to block the air inlet from communicating with the first space; controlling the third baffle to move to block the first space from communicating with the third space; and controlling the second baffle to move to allow the air inlet to communicate with the second space, such that the air entering through the air inlet flows to the outer air outlet after passing through the second space and the third space.

17. The heat dissipation method according to claim 14, further comprising:
   if the temperature of the display screen is higher than the second temperature threshold, decreasing a display brightness of the display screen.

18. The heat dissipation method according to claim 14, further comprising:
   regularly detecting the temperature of the display screen.

19. The heat dissipation method according to claim 14, further comprising:
   displaying information on the air-cooling heat dissipation mode on the display screen when the vehicle-mounted heat dissipation system is in the air-cooling heat dissipation mode; or
   displaying information on the water-cooling heat dissipation mode on the display screen when the vehicle-mounted heat dissipation system is in the water-cooling heat dissipation mode.

* * * * *